(12) United States Patent
Kuo et al.

(10) Patent No.: US 7,056,631 B2
(45) Date of Patent: Jun. 6, 2006

(54) EXPOSURE SYSTEM AND METHOD WITH GROUP COMPENSATION

(75) Inventors: Jung-Chih Kuo, Taichung (TW); Jen-Ho Chen, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 11 days.

(21) Appl. No.: 11/024,089

(22) Filed: Dec. 28, 2004

(65) Prior Publication Data

US 2005/0112480 A1    May 26, 2005

Related U.S. Application Data

(62) Division of application No. 10/629,030, filed on Jul. 28, 2003.

(30) Foreign Application Priority Data

Apr. 30, 2003    (TW) .............................. 92110137 A

(51) Int. Cl.
*G03F 9/00*    (2006.01)
*G03C 5/00*    (2006.01)

(52) U.S. Cl. ........................... 430/22; 430/30; 438/14; 438/401

(58) Field of Classification Search .................. 430/22, 430/30; 438/14, 401; 355/53
See application file for complete search history.

(56) References Cited

U.S. PATENT DOCUMENTS 6,737,208 B1 * 5/2004 Bode et al. .................... 430/30
6,815,232 B1 * 11/2004 Jones et al. .................... 438/14

* cited by examiner

*Primary Examiner*—Christopher G. Young
(74) *Attorney, Agent, or Firm*—Quintero Law Office

(57) ABSTRACT

An exposure system with group compensation. The exposure system includes a lot classification database, a compensation unit and a first exposure device. The lot classification database records a group classification of at least one lot wafer. The compensation unit obtains the group classification of the lot wafer from the lot classification database, retrieves a group compensation value according to the group classification, and compensates overlay parameters according to the group compensation value. The first exposure device performs a back-end process including overlay and exposure processes on the lot wafer using the compensated overlay parameters.

4 Claims, 2 Drawing Sheets

EXPOSURE SYSTEM AND METHOD WITH GROUP COMPENSATION

This application is a divisional of U.S. application Ser. No. 10/629,030, filed Jul. 28, 2003.

BACKGROUND OF THE INVENTION

1. Field of the Invention

The present invention relates to an exposure system and method, and particularly to an exposure system and method with group compensation for an exposure device in semiconductor manufacturing.

2. Description of the Related Art

Photolithography is one of the most important technologies in semiconductor manufacturing. It seriously affects structures of MOS devices, such as patterns of layers and doped regions. Typically, the number of masks used in photolithography indicates the complexity of a manufacturing process. As described above, since photolithography is complicated, the exposure device performing the photolithography can create a bottleneck in semiconductor manufacturing.

Exposure of wafers is generally implemented in a "Step and Repeat" fashion to transfer high resolution patterns to the wafers, the exposure device is thus referred to as Stepper. That is to say, the pattern on the mask is projected and sized to one portion or block of the wafer. This is repeatedly implemented for all blocks on the wafer one by one until the entire wafer is exposed.

FIG. 1 illustrates the overlay relation between front-end and back-end processes. In this case, the patterns of layers to be exposed in the respective back-end processes (back-end process 1 (101), back-end process 2 (102) and back-end process 3 (103)) have to overlay those in the front-end process 100. Since only the pattern of one of layers is transferred to the wafer after each block of the wafer is exposed, and there are many patterns of layers and corresponding masks involved in one manufacturing process, addition to piece alignment between the blocks of the wafer and overlay alignment between the patterns of the layers is essential to the photolithography processing step.

However, performance of an exposure device always slightly varies with time. For a precisely accurate exposure, the wafers processed must be measured to compensate for parameters (recipe) used by the exposure device. The recipe will be compensated and used by the exposure device to process the subsequent wafers. In general, the recipe compensation is implemented manually or using a feedback system. Taiwanese Patent 516099 discloses a method and apparatus of wafer exposure with correction feedback that employs a feedback system using a computer system to calculate values and use the values to compensate overlay parameters.

The device and mask used for exposure in the front-end process will affect the compensation for overlay parameters in the back-end processes. However, the conventional system calculates the compensation using mixed calculation, that is the device and mask used for exposure in the front-end process are not considered. Therefore, the compensation calculation for products processed by different devices and masks in the back-end processes will affect each other, thereby making the compensation calculation unstable, raising the rework rate, and damaging the throughput of the manufacturing process.

SUMMARY OF THE INVENTION

It is therefore an object of the present invention to provide an exposure system and method with recipe compensation in group classification for an exposure device in semiconductor manufacturing.

To achieve the above object, the present invention provides an exposure system. The exposure system includes a lot classification database, a compensation unit and a first exposure device. The lot classification database records a group classification of at least one lot wafer. The compensation unit obtains the group classification of the lot wafer from the lot classification database, retrieves a group compensation value according to the group classification, and compensates overlay parameters according to the group compensation value. The first exposure device performs a back-end process including overlay and exposure processes on the lot wafer using the compensated overlay parameters.

Further, an exposure method is provided. First, the group classification of a lot wafer is obtained. Then, a group compensation value is retrieved according to the group classification, and overlay parameters are compensated according to the group compensation value. Thereafter, a back-end process including overlay and exposure processes is performed to the lot wafer using the compensated overlay parameters.

The group classification of the lot wafer is determined according to the device and mask used in a front-end process. In addition, the group classification is updated after the lot wafer undergoes the back-end process.

BRIEF DESCRIPTION OF THE DRAWINGS

The aforementioned objects, features and advantages of the invention will become apparent by referring to the following detailed description of the preferred embodiment with reference to the accompanying drawings, wherein.

DETAILED DESCRIPTION OF THE INVENTION

Figure 1:
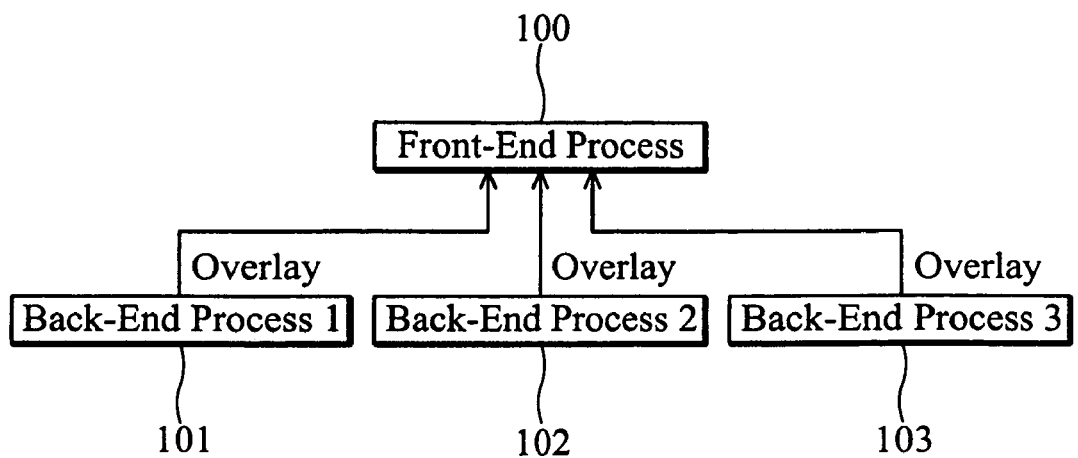
FIG. 1 is a schematic diagram illustrating the overlay relation between front-end and back-end processes.
Figure 2:
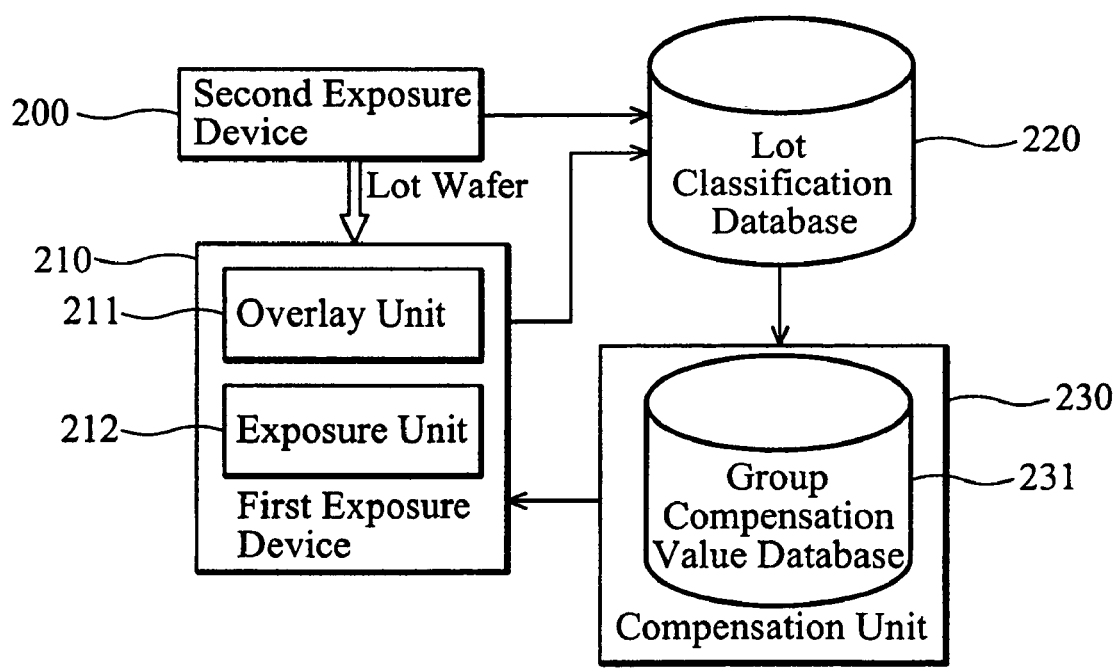
FIG. 2 is a schematic diagram illustrating an exposure system according to the present invention.

FIG. 2 illustrates the exposure system according to the present invention. The exposure system includes a first exposure device 210, a second exposure device 200, a lot classification database 220 and a compensation unit 230.

The first exposure device 210 includes an overlay unit 211 and an exposure unit 212. The overlay unit 101 performs an overlay process including piece alignment of blocks and overlay alignment of layers on a lot wafer according to overlay parameters, such as offset of X axis (Offset_X), offset of Y axis (Offset_Y), shot scaling of X axis (Shot Scaling X), shot scaling of Y axis (Shot Scaling Y), shot orthogonality (Shot Ortho), shot rotation (Shot Rot) and others. The exposure unit 212 performs an exposure process on the lot wafer after the overlay unit 101 performs the overlay process on the lot wafer. After the overlay and exposure processes, the processed lot wafer may be further processed in other manufacturing steps.

It should be noted that the second exposure device 200 may have similar components to that in the first exposure device 210. In this case, the second exposure device 200 may be the first exposure device 210. In the embodiment, the second exposure device 200 is the exposure device performing the front-end process of the lot wafer, and the first exposure device 210 is the exposure device performing the back-end process of the lot wafer.

The lot classification database 220 records the group classification information of each lot wafer in the production line. The group classification is determined according to the device and mask used in the front-end process, and the second exposure device 200 records the group classification of each lot wafer in the lot classification database 220 after the lot wafer undergoes the front-end process.

The compensation unit 230 has a group compensation value database 231 recording the group compensation values corresponding to respective group classification. The compensation unit 230 may obtain the group classification of the lot wafer from the lot classification database 220, retrieve a group compensation value from the group compensation value database 231 according to the group classification, and compensate overlay parameters used in the first exposure device 210 according to the group compensation value. The first exposure device 210 performs a back-end process including overlay and exposure processes on the lot wafer using the compensated overlay parameters.

Figure 3:
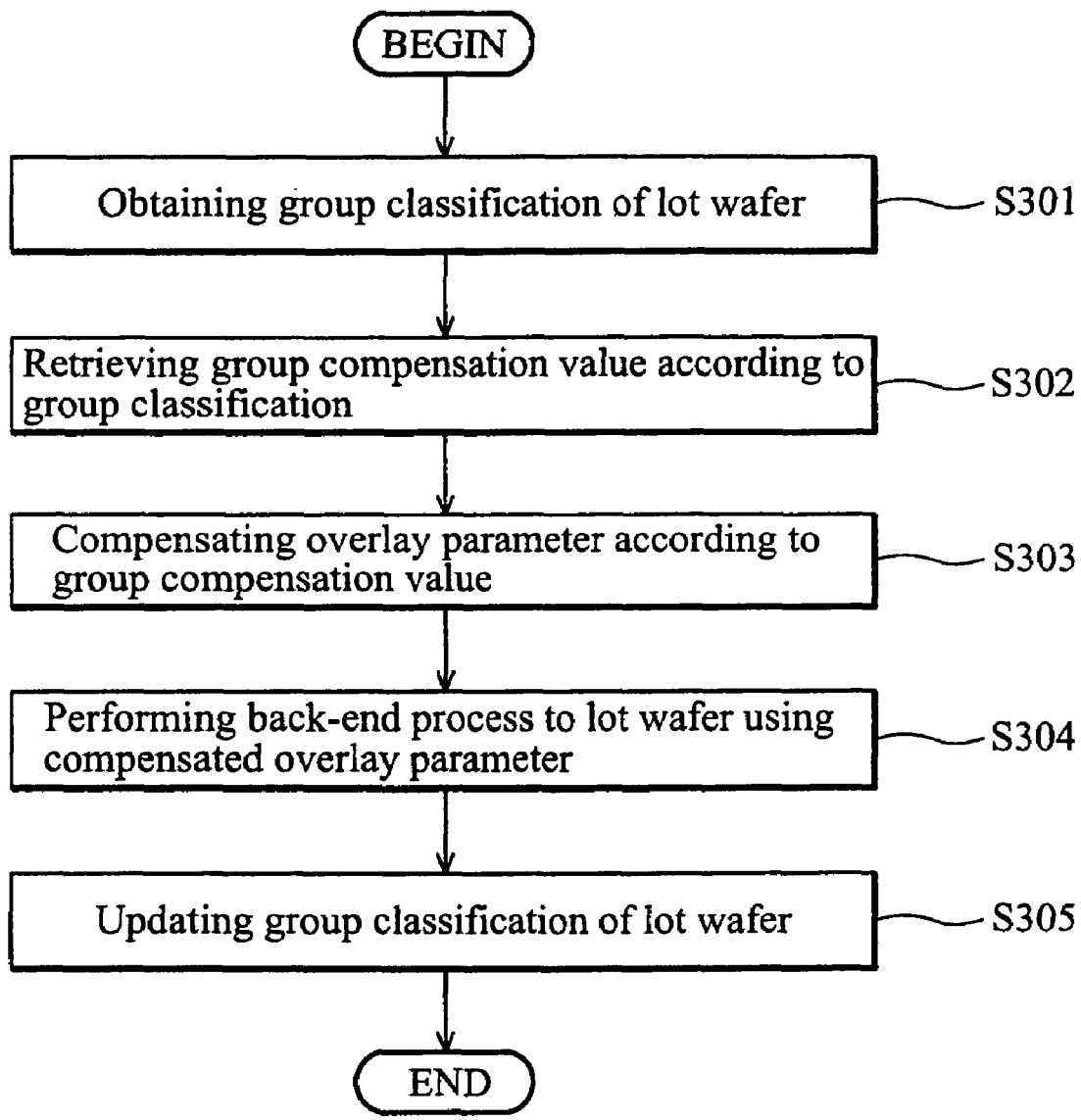
FIG. 3 is a flowchart showing an exposure method according to the present invention.

FIG. 3 shows the exposure method according to the present invention. First, in step S301, the compensation unit 230 obtains the group classification of the lot wafer from the lot classification database 220. It should be noted that after the lot wafer undergoes the front-end process, the second exposure device 200 determines the group classification of the lot wafer according to the device and mask used therein, and updates it to the lot classification database 220.

Then, in step S302, the compensation unit 230 retrieves a group compensation value from the group compensation value database 231 according to the group classification, and in step S303, compensates overlay parameters, such as Offset_X, Offset_Y, Shot Scaling X, Shot Scaling Y, Shot Ortho and Shot Rot used in the first exposure device 210 according to the group compensation value.

Thereafter, in step S304, the first exposure device 210 performs a back-end process including overlay and exposure processes on the lot wafer using the compensated overlay parameters. After the lot wafer undergoes the back-end process, in step S305, the first exposure device 210 updates the group classification of the lot wafer to the lot classification database 220 according to the device and mask used therein.

As a result, using the exposure system and method with group compensation according to the present invention, the lot wafers can be classified according to the device and mask used in the front-end process, and the compensation calculation in the back-end process can be separately performed in respective group classification, thereby reducing the rework rate and improving the throughput of the manufacturing process.

Although the present invention has been described in its preferred embodiments, it is not intended to limit the invention to the precise embodiments disclosed herein. Those who are skilled in this technology can still make various alterations and modifications without departing from the scope and spirit of this invention. Therefore, the scope of the present invention shall be defined and protected by the following claims and their equivalents.

The invention claimed is:

1. An exposure method with group compensation, comprising the steps of:
   obtaining a group classification of a lot of wafers, in which the group classification is determined according to a device and a mask used in a front-end process;
   retrieving a group compensation value according to the group classification;
   compensating at least one overlay parameter according to the group compensation value; and
   performing a back-end process including overlay and exposure processes on the lot of wafers using the compensated overlay parameters.

2. The exposure method with group compensation as claimed in claim 1 further comprising providing a second exposure device to perform the front-end process on the lot of wafers, and determine the group classification of the lot of wafers.

3. The exposure method with group compensation as claimed in claim 1 further comprising updating the group classification after the lot of wafers undergoes the back-end process.

4. The exposure method with group compensation as claimed in claim 3 wherein the group classification is updated according to the device and mask used in the back-end process.

* * * * *